(12) United States Patent
Clevenger et al.

(10) Patent No.: US 7,750,335 B2
(45) Date of Patent: Jul. 6, 2010

(54) PHASE CHANGE MATERIAL STRUCTURE AND RELATED METHOD

(75) Inventors: Lawrence A. Clevenger, LaGrangeville, NY (US); Bruce G. Elmegreen, Goldens Bridge, NY (US); Deok-Kee Kim, Bedford Hills, NY (US); Chandrasekharan Kothandaraman, Hopewell Junction, NY (US); Lia Krusin-Elbaum, Dobbs Ferry, NY (US); Chung H. Lam, Peekskill, NY (US); Dennis M. Newns, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 11/839,724

(22) Filed: Aug. 16, 2007

(65) Prior Publication Data
US 2009/0045388 A1   Feb. 19, 2009

(51) Int. Cl.
*H01L 47/00* (2006.01)
(52) U.S. Cl. ............. 257/4; 257/E45.002; 257/E27.104

(58) Field of Classification Search ............. 257/4, 257/E45.002, E27.104
See application file for complete search history.

(56) References Cited

U.S. PATENT DOCUMENTS

| | | | | |
|---|---|---|---|---|
| 2007/0099405 A1* | 5/2007 | Oliva et al. | ............. | 438/585 |
| 2007/0148855 A1* | 6/2007 | Chen et al. | ............. | 438/238 |
| 2008/0044632 A1* | 2/2008 | Liu et al. | ............. | 428/192 |
| 2009/0014885 A1* | 1/2009 | Chen et al. | ............. | 257/774 |

* cited by examiner

*Primary Examiner*—Minh-Loan T Tran
(74) *Attorney, Agent, or Firm*—Katherine Brown; Hoffman Warnick LLC

(57) ABSTRACT

A structure including a phase change material and a related method are disclosed. The structure may include a first electrode; a second electrode; a third electrode; a phase change material electrically connecting the first, second and third electrodes for passing a first current through two of the first, second and third electrodes; and a refractory metal barrier heater layer about the phase change material for converting the phase change material between an amorphous, insulative state and a crystalline, conductive state by application of a second current to the phase change material. The structure may be used as a fuse or a phase change material random access memory (PRAM).

11 Claims, 6 Drawing Sheets

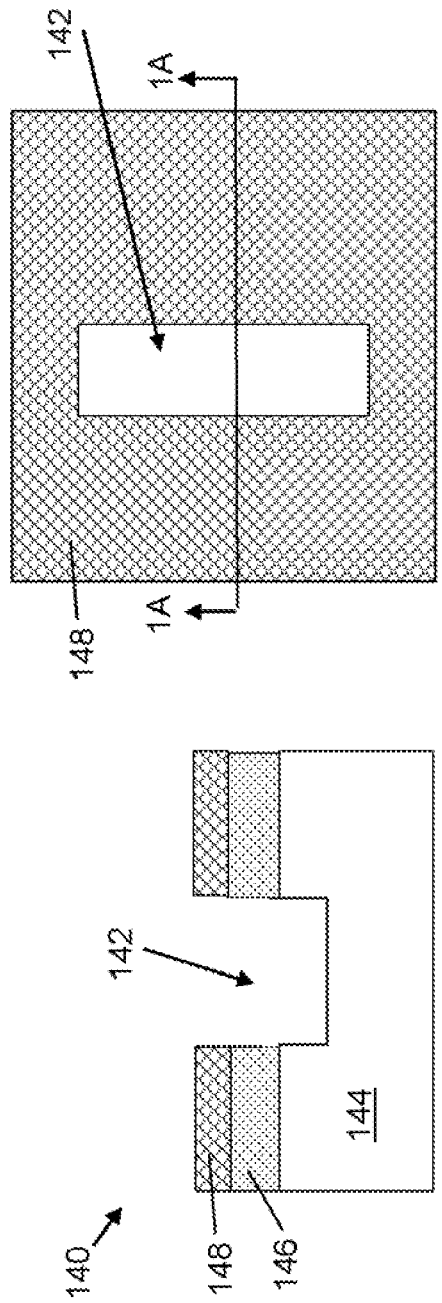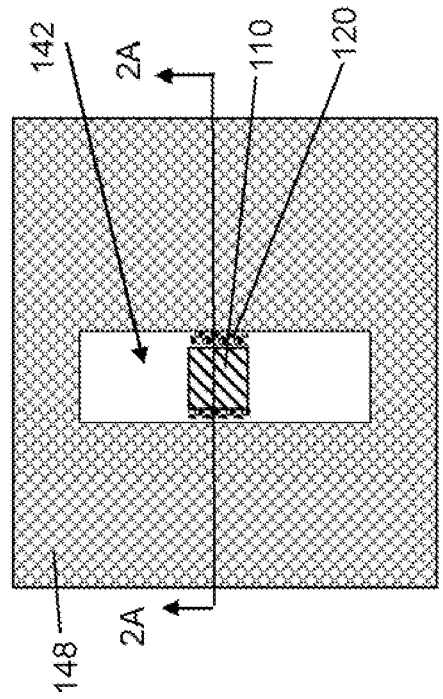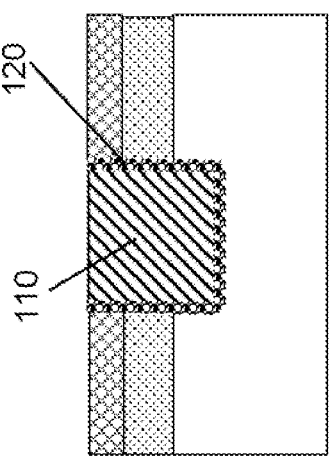

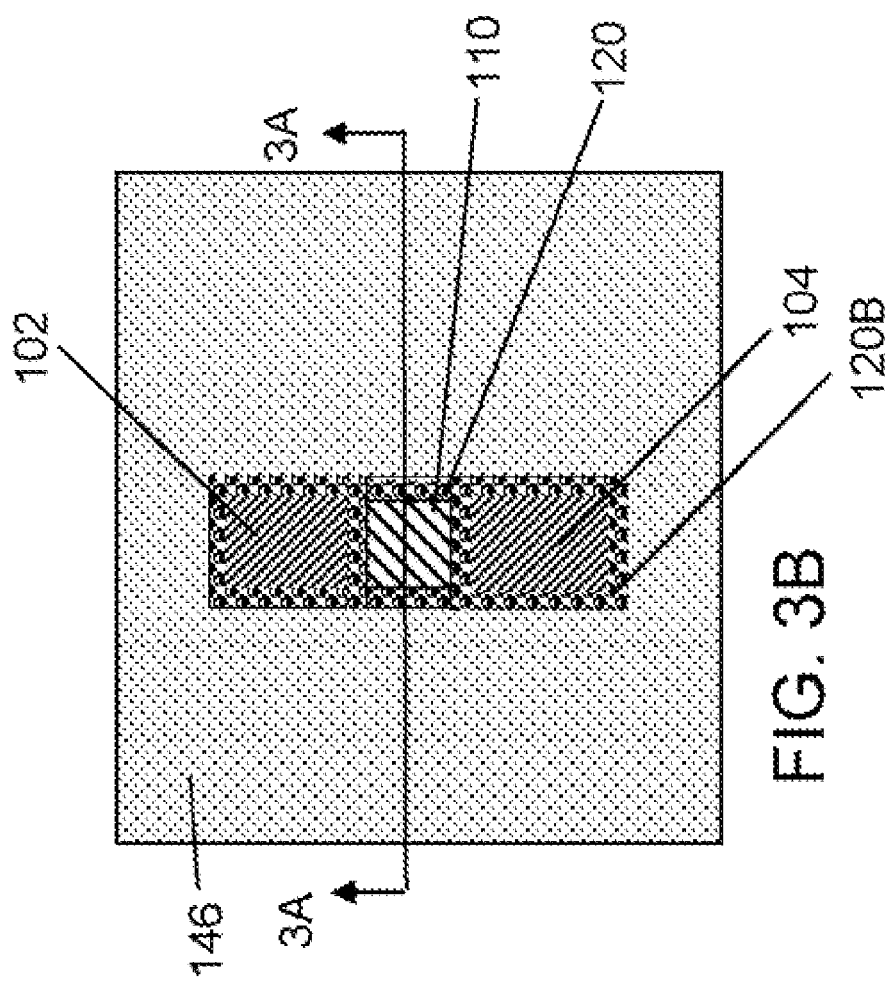
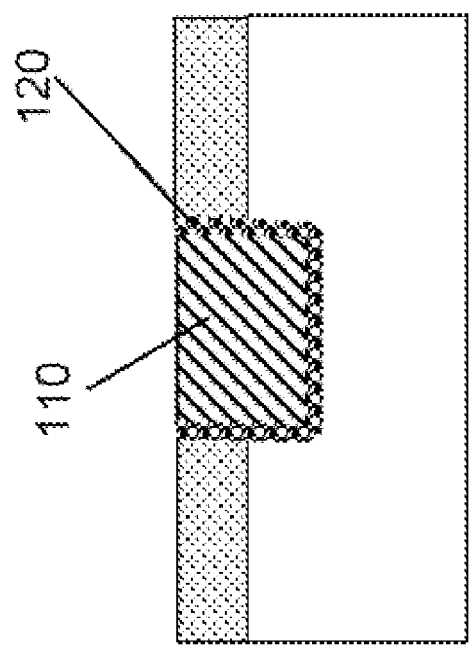
FIG. 3A
FIG. 3B

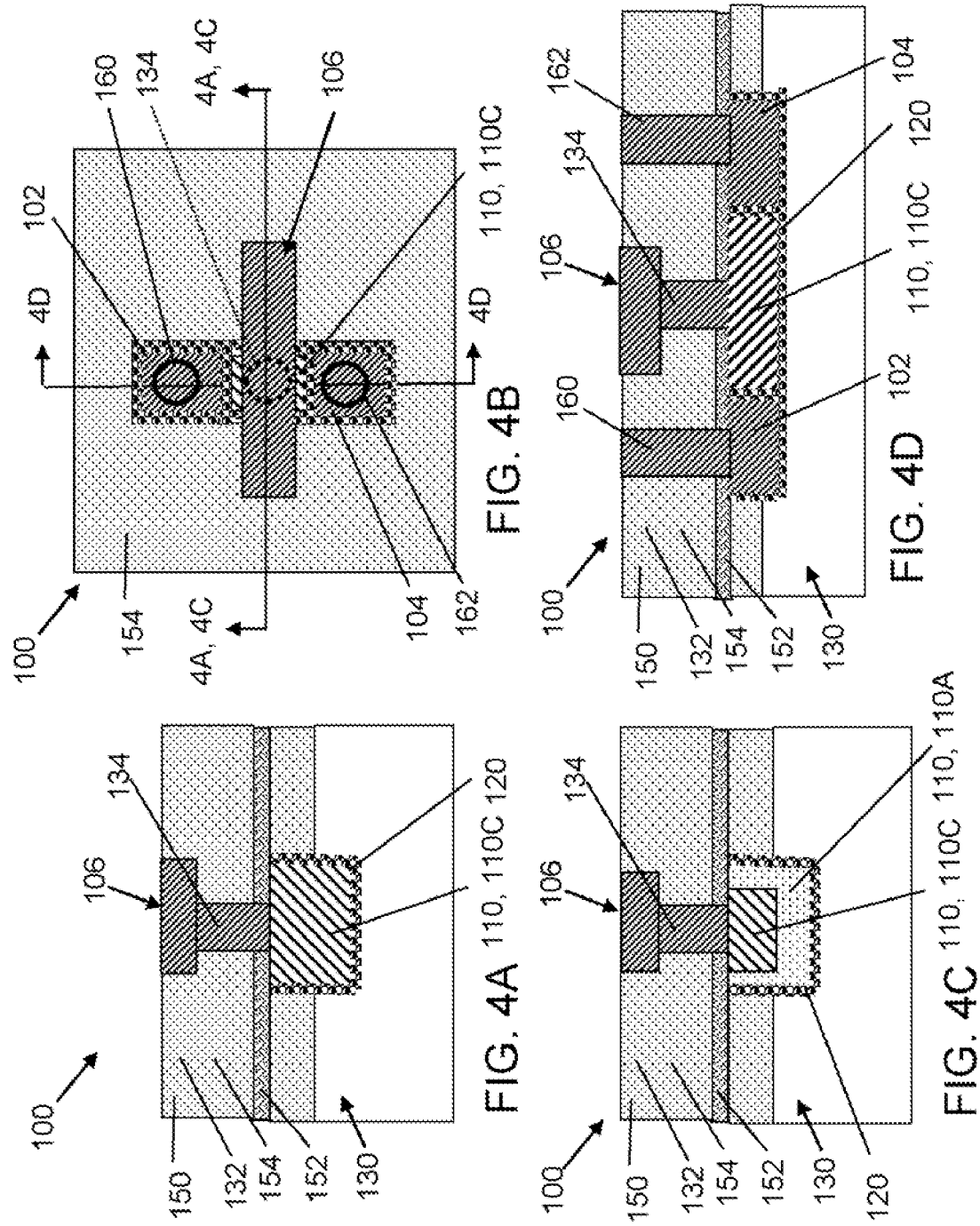

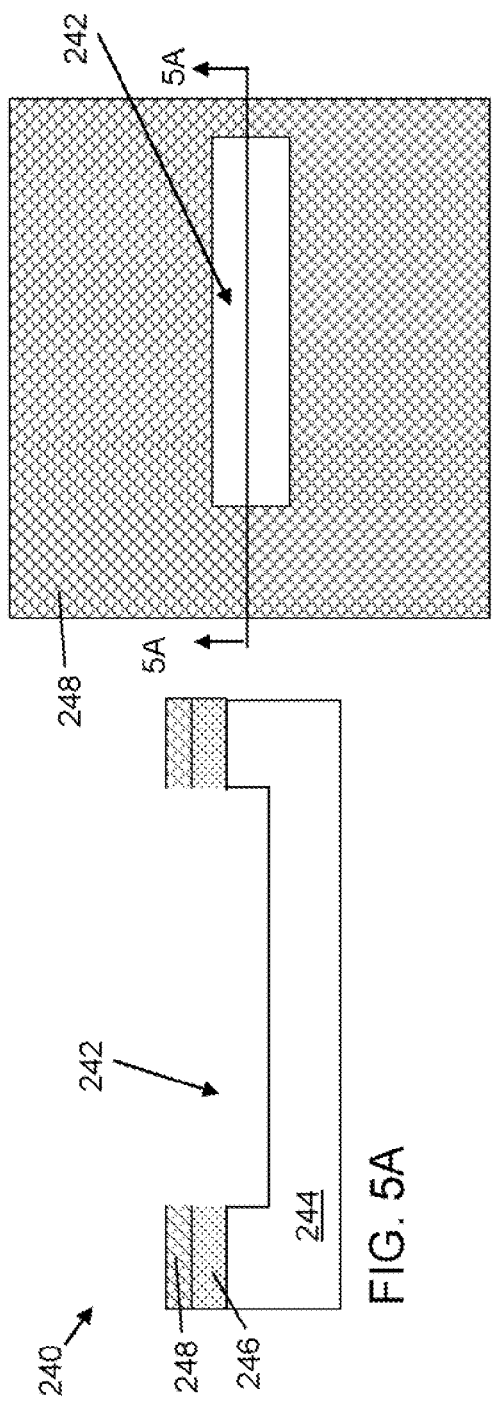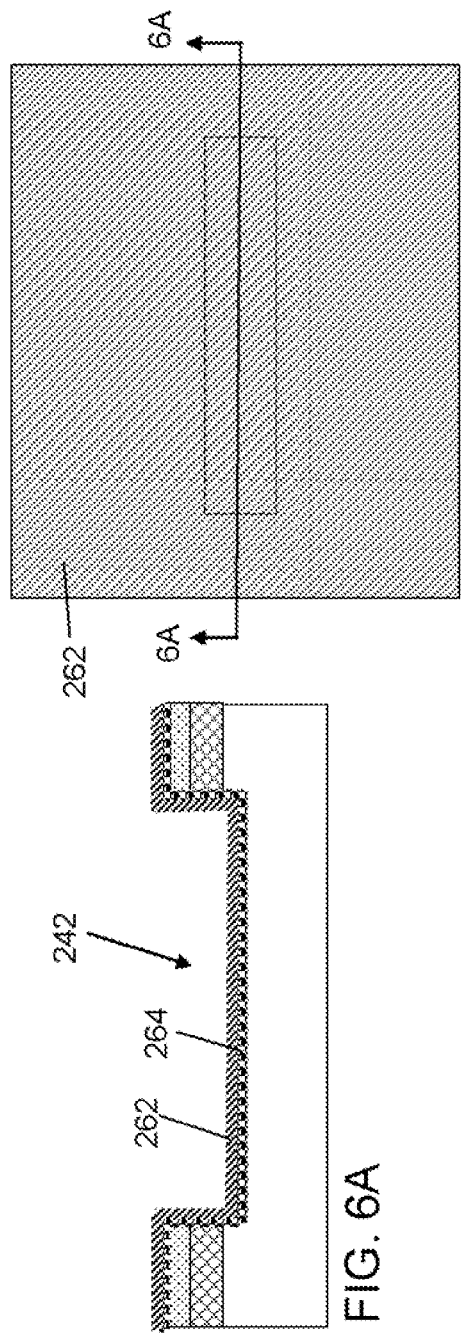

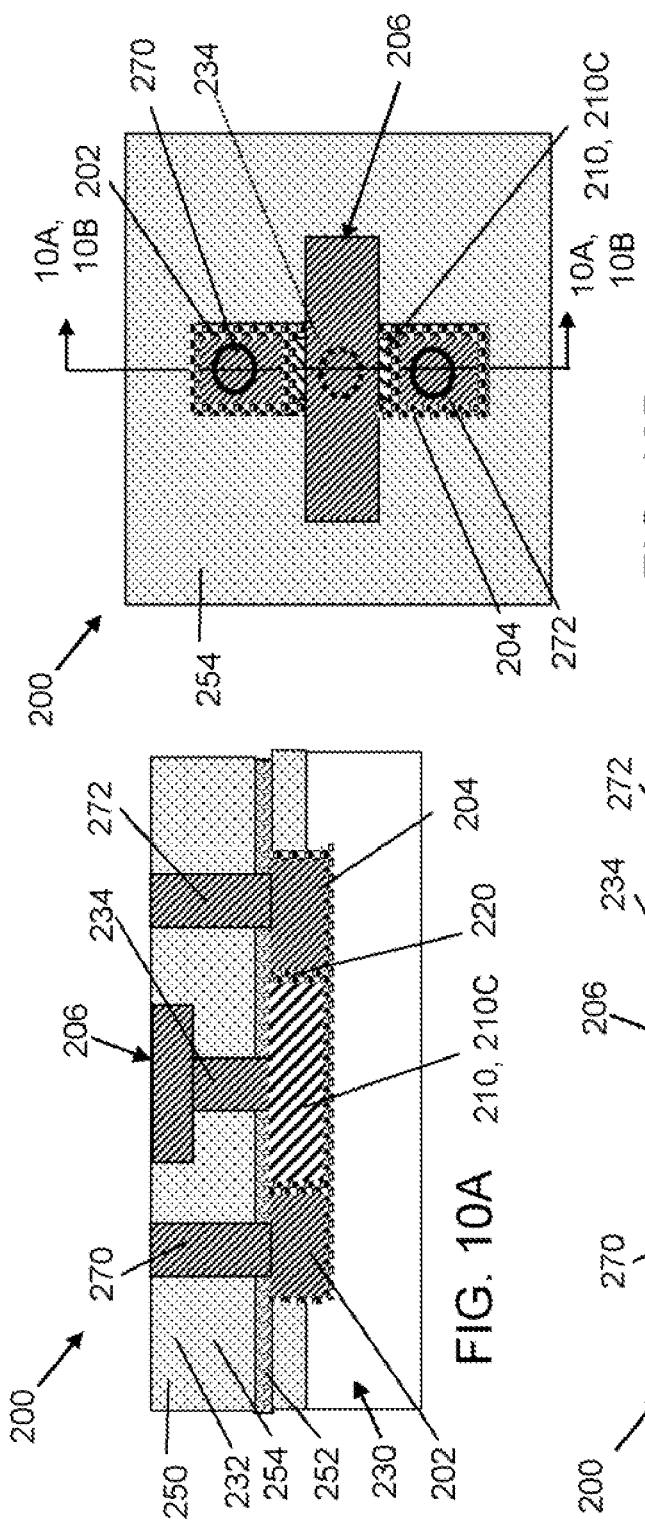

PHASE CHANGE MATERIAL STRUCTURE AND RELATED METHOD

BACKGROUND

1. Technical Field

The disclosure relates generally to integrated circuit (IC) chip fabrication, and more particularly, to a phase change material structure and a related method.

2. Background Art

Electronic fuses are used in IC chips, for example, to correct inoperative parts by turning on or off sections. Current electronic fuse (efuse) technology is based on techniques such as electromigration, rupture or agglomeration. These fuse technologies suffer from a number of drawbacks. For example, they are single use, take up large areas, involve quite large amounts of power/current, and are very slow, e.g., microseconds. As fuse technology develops, higher performance is desirable to, for example, reduce area taken up by the fuse, address sun-setting of the non-standard high voltages/currents required (e.g., for electromigration fuses), provide multiple use reprogrammable fuses, and enhance speed.

Phase change material is a type of material capable of resistance changes depending on the mechanical phase of the material. Phase change material is used for phase change memory (PCM), which may also be known as ovonic unified memory (OUM), chalcogenide random access memory (CRAM) or phase-change random access memory (PRAM). Phase change material has not been used for fuse technology.

Almost all PCMs are built using a chalcogenide alloy, typically a mixture of germanium (Ge), antimony (Sb) and tellurium (Te), which is referred to as GST. One GST alloy has the formula: $Ge_2Sb_2Te_5$. Under high temperature (over 600° C.), a chalcogenide becomes liquid and by subsequent rapid cooling it is frozen into an amorphous glass-like state and its electrical resistance is high. By heating the chalcogenide to a temperature above its crystallization point, but below the melting point, it will transform into a crystalline state with a much lower resistance. In addition, when the material is set to a particular state representing a resistance value, the value is retained until reset by another phase change of the material. The phase switching can be completed very quickly, e.g., under 10 ns. During use as a PCM, the phase of the phase change material is typically changed by heat created by a small pulse of electrical power. Typically, this heat is provided by an internal heater, which presents reproducibility and manufacturing challenges.

SUMMARY

A structure including a phase change material and a related method are disclosed. The structure may include a first electrode; a second electrode; a third electrode; a phase change material electrically connecting the first, second and third electrodes for passing a first current through two of the first, second and third electrodes; and a refractory metal barrier heater layer about the phase change material for converting the phase change material between an amorphous, insulative state and a crystalline, conductive state by application of a second current to the phase change material. The structure may be used as a fuse or a phase change material random access memory (PRAM).

A first aspect of the disclosure provides a structure comprising: a first electrode; a second electrode; a third electrode; a phase change material electrically connecting the first, second and third electrodes for passing a first current through two of the first, second and third electrodes; and a refractory metal barrier heater layer about the phase change material for converting the phase change material between an amorphous, insulative state and a crystalline, conductive state by application of a second current to the phase change material.

A second aspect of the disclosure provides a method of forming a structure, the method comprising: providing a dielectric layer; forming an opening in the dielectric layer; forming a first electrode and a second electrode coupled to the first electrode by a phase change material in the opening having a refractory metal barrier heater layer at least partially thereabout; and forming a third electrode coupled to the phase change material.

A third aspect of the disclosure provides a structure comprising: a first copper electrode; a second copper electrode; a third copper electrode; a phase change material electrically connecting the first, second and third copper electrodes for passing a first current through two of the first, second and third copper electrodes; and a refractory metal barrier heater layer about the phase change material for converting the phase change material between an amorphous, insulative state and a crystalline, conductive state by application of a second current to the phase change material, wherein two of the first, second and third copper electrodes are positioned in one metal layer of an integrated circuit (IC) chip, and the other copper electrode is positioned in another metal layer of the IC chip and coupled to the phase change material by a contact.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 1A-4D show one embodiment of a method of forming a structure according to the disclosure, with FIGS. 4A-D showing the structure.

FIGS. 5A-10C show another embodiment of a method of forming a structure according to the disclosure, with FIGS. 10A-C showing the structure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 7B:
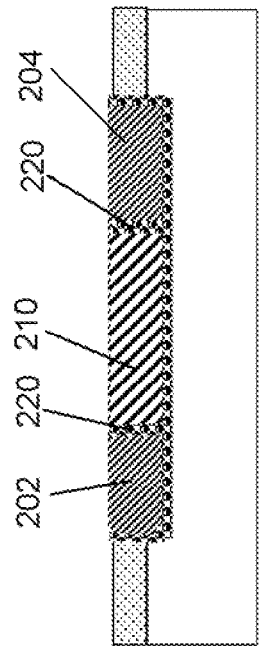
Figure 9:
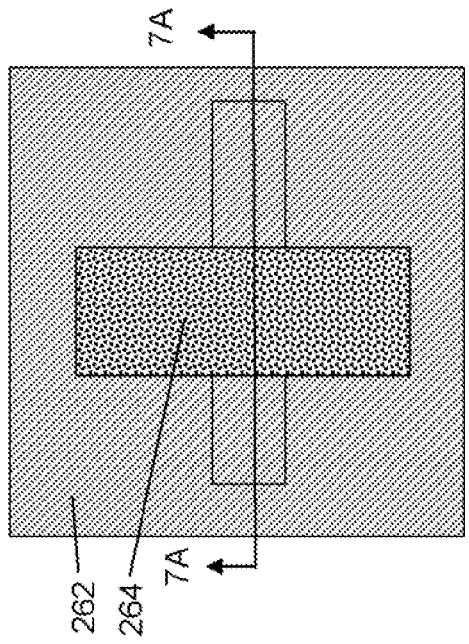
Figure 7A:
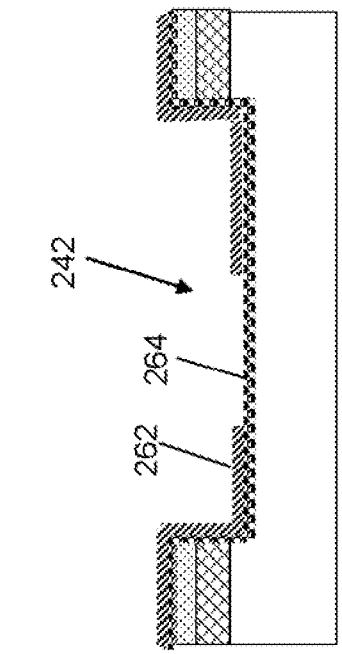
Figure 8:
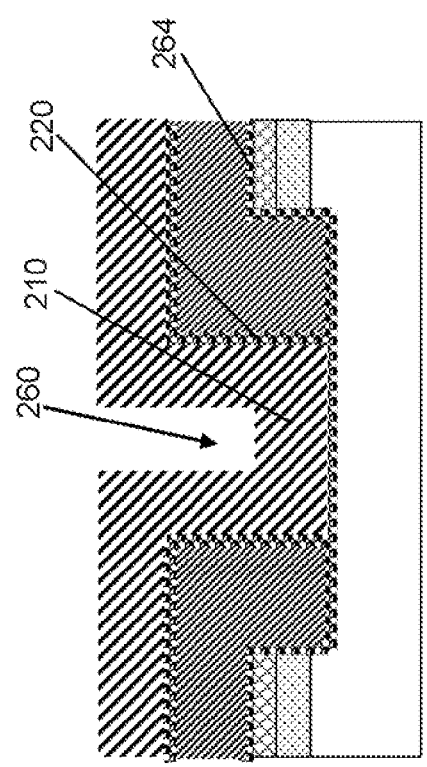

Turning to the drawings, FIGS. 4A-D and 10A-C show embodiments of a structure 100, 200 according to the disclosure. In the drawings, figures labeled with a "B" are top views, and the other drawings are cross-sectional views along the view lines indicated in the corresponding "B" labeled drawings. FIGS. 8 and 9 do not include a corresponding top view for brevity sake.

Each structure 100, 200 includes a first electrode 102, 202, a second electrode 104, 204 and a third electrode 106, 206, respectively. In addition, each structure 100, 200 includes a phase change material 110, 210 electrically connecting first electrode 102, 202, second electrode 104, 204 and third electrode 106, 206. Phase change material 110, 210 allows for passing of a first current through two of first, second and third electrodes. A refractory metal barrier heater layer 120, 220

(hereinafter "heater layer") extends about phase change material 110, 210 for converting phase change material 110, 210 between an amorphous, insulative state 110A, 210A and a crystalline, conductive state 110C, 210C by application of a second current to the phase change material. Refractory metal barrier heater layer 120, 220 may include, for example, tantalum nitride (TaN), silicon-doped TaN, titanium nitride (TiN), silicon-doped TiN, zirconium nitride (ZrN), silicon-doped ZrN, niobium nitride (NbN), silicon-doped NbN, or other refractory metal layer 120, 220 having good surface adhesive properties to phase change material 110, 210, respectively. The second current may be applied by applying an increased current to the two electrodes carrying the first current, or by applying the second current to the other electrode not carrying the first current. In any event, the increased heat created by application of the second current is sufficient to convert the crystalline phase change material 110C, 210C to be sufficiently amorphous 110A, 210A so as to be insulative. As shown in FIGS. 4C and 10C, the conversion from crystalline to amorphous does not have to be complete. In this situation, structures 100, 200 act as multiple use, reprogrammable fuses, analogous to how PCM are used for memory applications.

Structures 100, 200 may function as a fuse or a phase change random access memory (PRAM) cell. Where structures 100, 200 are used as PRAM, they will typically require a smaller cell size/higher packing density, but the operation of a single PRAM cell is the same as that of the fuse in terms of programming and sensing currents. Heater layer 120, 220 obviates the need for a separate heater as is conventionally used, and, as will be described herein, allows for easier manufacturing and/or reproducibility using existing complementary metal-oxide semiconductor (CMOS) back-end-of-line (BEOL) processing technology in a new manner.

In one embodiment, two of the electrodes, e.g., first electrode 102, 202 and second electrode 104, 204, and phase change material 110, 210 are positioned in a first metal layer 130, 230 of an integrated circuit (IC) chip, i.e., transistors are positioned below layer 130. In another embodiment, two of the electrodes (e.g., first electrode 102, 202 and second electrode 104, 204) are positioned in one metal layer of an IC chip, and the other electrode (e.g., third electrode 106, 206) is positioned in another metal layer 132, 232 of the IC chip and coupled to phase change material 110, 210 by a contact 134, 234. However, structures 100, 200 may be positioned within any BEOL layer, thus other arrangements may be possible and are considered within the teachings of the disclosure. In one embodiment, each electrode includes copper (Cu), however, other conductive materials may also be employed. Further, in one embodiment, phase change material 110, 210 may include a germanium (Ge), antimony (Sb) and tellurium (Te) alloy (commonly referred to as GST) or a germanium (Ge), antimony (Sb) and silicon (Si) alloy (GeSbSi). Other phase change materials may also be employed within the scope of the disclosure.

Returning to the beginning of the drawings, structures 100, 200 may be formed using at least two methodologies. Others may also be possible and are considered within the scope of the disclosure. FIGS. 1A-4D show one embodiment for forming structure 100 (FIGS. 4A-4D). FIGS. 1A-B show providing a dielectric layer 140, and forming an opening 142 in dielectric layer 140. Dielectric layer 140 may include a plurality of dielectric layers including, for example, a layer of tetraethyl orthosilicate, $Si(OC_2H_5)_4$ (TEOS) based silicon oxide ($SiO_2$) and boro-phosphorous silica glass 144, a layer of hydrogenated silicon oxycarbide (SiCOH) 146 and a layer of TEOS based silicon oxide ($SiO_2$) 148. Other arrangements of dielectric layers such as ultra low-K dielectrics or air gap integration structures may also be employed. Opening 142 may be formed using any now known or later developed processing, e.g., deposition of an antireflective coating (ARC) and a photoresist (PR) (neither shown), patterning and etching of the ARC and PR and etching opening 142. Other dielectric layers, e.g., low temperature oxide (LTO) or near frictionless carbon (NFC), may be provided and removed as part of forming opening 142.

FIGS. 2A-3B show forming first electrode 102 and second electrode 104 coupled to first electrode 102 by phase change material 110 in opening 142 and having heater layer 120 at least partially thereabout. FIGS. 2A-B show forming phase change material 110 having heater layer 120 at least partially thereabout in a portion of opening 142. Phase change material 110 and heater layer 120 may be formed using any now known or later developed CMOS processing, e.g., a deposition of TaN, a phase change material sputter deposition, block mask etching of the phase change material and TaN, and stripping of mask (not shown). As indicated above, in one embodiment, phase change material 110 may include, for example, GST or a GeSbSi alloy. FIGS. 3A-3B show forming first electrode 102 and second electrode 104 adjacent to phase change material 110 in opening 142 (FIG. 2B). As indicated above, in one embodiment, each electrode 102, 104, 106 may include copper (Cu). In this case, this process may include, for example, depositing a liner (heater layer 120B) such as tantalum and/or tantalum nitride, perhaps depositing a seed layer (e.g., copper), depositing a conductor (e.g., copper) and planarizing (e.g., chemical mechanical polishing (CMP)). Other conductors may employ different processes. As shown in FIGS. 3A-B, first electrode 102, second electrode 104 and phase change material 110 may be positioned in a first metal layer 130 of an IC chip. However, structure 100 (FIGS. 4A-D) may be formed in other BEOL layers.

FIGS. 4A-D show forming third electrode 106 coupled to phase change material 110. In one embodiment, this process may include depositing another dielectric layer 150, e.g., with a silicon nitride ($Si_3N_4$) layer 152 and a SiCOH layer 154, and performing a dual damascene process to form third electrode 106, i.e., forming an opening for a contact and wire together and filling the opening. As indicated, third electrode 106 may include a portion of a metal layer 132 and a contact 134 in a corresponding via layer. The dual damascene process may further include, as shown in FIGS. 4B and 4D, forming a first contact 160 to first electrode 102 and a second contact 162 to second electrode 104.

In operation, a first current passes between two of electrodes 102, 104, 106 (e.g., electrodes 104, 106) where phase change material 110 is in a crystalline, conductive state and passage of the first current is prevented by application of a second current to the other electrode (e.g., 102) that converts phase change material 110 to an amorphous, insulative state. In this situation, structure 100 acts as multiple use, reprogrammable fuse.

FIGS. 5A-10C show one embodiment for forming structure 200 (FIGS. 10A-10C). FIGS. 5A-B show providing a dielectric layer 240, and forming an opening 242 in dielectric layer 240. Dielectric layer 240 may include a plurality of dielectric layers including, for example, a layer of tetraethyl orthosilicate, $Si(OC_2H_5)_4$ (TEOS) based silicon oxide ($SiO_2$) and boro-phosphorous silica glass 244, a layer of hydrogenated silicon oxycarbide (SiCOH) 246 and a layer of TEOS based silicon oxide ($SiO_2$) 248. Other arrangements of dielectric layers may also be employed. Opening 242 may be formed using any now known or later developed processing, e.g., deposition of an antireflective coating (ARC) and a photoresist (PR) (neither shown), patterning and etching of the ARC and PR and etching opening 242. Other dielectric layers, e.g., low temperature oxide (LTO) or near frictionless carbon (NFC), may be provided and removed as part of forming opening 242.

FIGS. 6A-9 show forming first electrode 202 (FIG. 9) and second electrode 204 (FIG. 9) coupled to first electrode 202 (FIG. 9) by phase change material 210 (FIG. 9) in opening 242 (FIG. 6A) and having heater layer 220 at least partially thereabout (i.e., at least partially thereabout). FIGS. 6A-8 show forming first electrode 202 and second electrode 204 in opening 242 leaving a gap 260 (FIG. 8) therebetween. FIGS. 6A-B show depositing a copper (Cu) seed layer 262 over a liner (heater) layer 264 (e.g., tantalum nitride, tantalum, etc.) within opening 242. FIGS. 7A-B show removing copper seed layer 262 to liner layer 264 where gap 260 is to be positioned, e.g., by patterning a mask and etching copper seed layer 262 (an additional example would be to remove the TaN and the Cu seed if present). FIGS. 8-9 show forming first and second electrode 202, 204 using copper seed layer 260, e.g., by copper (Cu) electroplating. Further, FIGS. 8-9 show forming heater layer 220 and phase change material 210 in gap 260. This process may include depositing heater layer 220 and phase change material 210 and planarizing using CMP.

FIGS. 10A-D show forming third electrode 206 coupled to phase change material 210. In one embodiment, this process may include depositing another dielectric layer 250, e.g., with a silicon nitride (Si3N4) layer 252 and a SiCOH layer 254, and performing a dual damascene process to form third electrode 206, i.e., forming an opening for a contact and wire together and filling the opening. As indicated, third electrode 206 may include a portion of a metal layer 232 and a contact 234 in a corresponding via layer. The dual damascene process may further include, as shown in FIGS. 10A-C, forming a first contact 270 to first electrode 202 and a second contact 272 to second electrode 204.

In operation, a first current passes between two of electrodes 202, 204, 206 (e.g., electrodes 202, 206) where phase change material 210 is in a crystalline, conductive state and passage of the first current is prevented by application of a second current to the other electrode (e.g., 204) that converts phase change material 210 to an amorphous, insulative state. In this situation, structure 200 acts as multiple use, reprogrammable fuse.

The method and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A structure comprising:
    a first electrode;
    a second electrode;
    a third electrode;
    a phase change material electrically connecting the first, second and third electrodes for passing a first current through two of the first, second and third electrodes; and
    a refractory metal barrier heater layer at least partially surrounding the phase change material for converting the phase change material between an amorphous, insulative state and a crystalline, conductive state by application of a second current to the phase change material,
    wherein the first electrode and the second electrode are positioned in one metal layer of an integrated circuit (IC) chip, and the third electrode is positioned in another metal layer of the IC chip and coupled to the phase change material by a contact.

2. The structure of claim 1, wherein each electrode includes copper (Cu).

3. The structure of claim 1, wherein the phase change material is selected from the group consisting of: germanium (Ge), antimony (Sb) and tellurium (Te) alloy and a germanium (Ge), antimony (Sb) and silicon (Si) alloy.

4. The structure of claim 1, wherein the second current is applied to the electrode not carrying the first current.

5. The structure of claim 1, wherein the refractory metal baffler heater layer is selected from the group consisting of: tantalum nitride (TaN), silicon-doped TaN, titanium nitride (TiN), silicon-doped TiN, zirconium nitride (ZrN), silicon-doped ZrN, nobium nitride (NbN), and silicon-doped NbN.

6. The structure of claim 1, wherein the structure is one of a fuse and a phase change random access memory (PRAM) cell.

7. A structure comprising:
    a first copper electrode;
    a second copper electrode;
    a third copper electrode;
    a phase change material electrically connecting the first, second and third copper electrodes for passing a first current through two of the first, second and third copper electrodes; and
    a refractory metal baffler heater layer at least partially surrounding the phase change material for converting the phase change material between an amorphous, insulative state and a crystalline, conductive state by application of a second current to the phase change material,
    wherein the first copper electrode and the second copper electrode are positioned in one metal layer of an integrated circuit (IC) chip, and the third copper electrode is positioned in another metal layer of the IC chip and coupled to the phase change material by a contact.

8. The structure of claim 7, wherein the structure is one of a fuse and a phase change random access memory (PRAM) cell.

9. The structure of claim 7, wherein the phase change material is selected from the group consisting of: germanium (Ge), antimony (Sb) and tellurium (Te) alloy, and a germanium (Ge), antimony (Sb), and silicon (Si) alloy.

10. The structure of claim 7, wherein a second current is applied to the copper electrode not carrying the first current.

11. The structure of claim 7, wherein the refractory metal barrier heated layer is selected from the group consisting of: tantalum nitride (TaN), silicon-doped TaN, titanium nitride (TiN), silicon-doped TiN, zirconium nitride (ZrN), silicon-doped ZrN, nobium nitride (NbN), and silicon-doped NbN.

* * * * *